United States Patent

Morishima

[11] Patent Number: 6,124,749
[45] Date of Patent: Sep. 26, 2000

[54] SEMICONDUCTOR CIRCUIT DEVICE WITH REDUCED POWER CONSUMPTION

[75] Inventor: Chikayoshi Morishima, Tokyo, Japan

[73] Assignee: Mitsubishi Denki Kabushiki Kaisha, Tokyo, Japan

[21] Appl. No.: 09/080,259

[22] Filed: May 18, 1998

[30] Foreign Application Priority Data

Jan. 21, 1998 [JP] Japan .................................. 10-009830

[51] Int. Cl.⁷ .................................................. H03K 17/16
[52] U.S. Cl. .......................... 327/390; 327/534; 327/544; 326/56
[58] Field of Search .................................. 326/56, 57, 58, 326/88, 92; 327/108, 111, 112, 390, 530, 534, 544

[56] References Cited

U.S. PATENT DOCUMENTS

| | | | |
|---|---|---|---|
| 5,151,620 | 9/1992 | Lin ........................................... | 307/475 |
| 5,450,027 | 9/1995 | Gabara ........................................ | 326/98 |
| 5,801,576 | 9/1998 | Ooishi ....................................... | 327/530 |
| 5,854,567 | 12/1998 | Meier et al. ............................. | 327/437 |

FOREIGN PATENT DOCUMENTS 7-141877  6/1995  Japan .

*Primary Examiner*—Jeffrey Zweizig
*Attorney, Agent, or Firm*—Burns, Doane, Swecker & Mathis, LLP

[57] ABSTRACT

In the semiconductor circuit device of the present invention, the switching circuit 10 connects the power supply pin 4 to the capacitance 9 before the input signal 2 to the semiconductor circuit 1 is changed so that the electric charge of the semiconductor 1 is stored in the capacitance 9, and when the input signal 2 is changed, the semiconductor circuit 1 is charged with the electric charge stored in the capacitance 9. And, after the input signal 2 is changed, the switching circuit 10 connects the power supply pin 4 to a power supply to charge the semiconductor circuit 1.

4 Claims, 12 Drawing Sheets

SEMICONDUCTOR CIRCUIT DEVICE WITH REDUCED POWER CONSUMPTION

BACKGROUND OF THE INVENTION

1. Field of the Invention

The present invention relates to a semiconductor circuit device that needs less power consumption.

2. Description of the Prior Art

FIG. 16 is a configuration of a semiconductor circuit device that uses conventional CMOS (Complementary Metal Oxide Semiconductor) circuits. In order to simplify the explanation, it is assumed here that the semiconductor circuit device comprises CMOS inverter circuits arranged in 3 stages. In FIG. 16, reference numeral 101 denotes a CMOS inverter circuit composed of a P-type transistor P1 and an N-type transistor N1. 102 denotes a CMOS inverter circuit composed of a P-type transistor P2 and an N-type transistor N2. 103 denotes a CMOS inverter circuit composed of a P-type transistor P3 and an N-type transistor N3. C1, C2, and C3 denote capacitances such as interconnecting capacitance formed between the output node of each of the CMOS inverter circuits 101, 102, and 103 and the ground respectively. 104 denotes an input signal to the CMOS inverter circuit 101. 105 denotes an output signal from the CMOS inverter circuit 103.

Next, the operation of the semiconductor circuit will be explained.

When the input signal 104 is at "L" level, the capacitances C1 and C3 are charged up to the power supply potential Vdd by the P-type transistors P1 and P3 provided in the CMOS inverter circuits 101 and 103 respectively. The capacitance C2 is discharged up to the ground potential by the N-type transistor N2 provided in the CMOS inverter circuit 102. When the input signal 104 is changed from "L" level to "H" level, the capacitances C1 and C3 are discharged up to the ground potential by the N-type transistors N1 and N3 provided in the CMOS inverter circuits 101 and 103 respectively. The capacitance C2 is charged up to the power supply potential Vdd by the P-type transistor P2 provided in the CMOS inverter circuit 102. When the input signal 104 is changed from "H" level to "L" level, the capacitances C1, C2, and C3 are charged or discharged in the same way in the range a potential between the power supply potential Vdd and the ground potential.

Although CMOS inverter circuits are picked up for explanation here, other CMOS circuits such as CMOS NAND and CMOS NOR circuits, as well as a BiCMOS circuit, which is a combination of CMOS and bipolar circuits, may be used to repeat charging and discharging between power supply potential and ground potential to transmit signals as explained above.

Since the conventional semiconductor circuit device is constructed as described above, the electric charge charged up to the power supply potential Vdd is discharged completely each time a signal is changed, and accordingly the conventional semiconductor circuit device has a problem that the circuit needs much power consumption.

FIG. 17 is a configuration of the concept on how to reuse an electric charge, disclosed in JP-A No. Hei 7-141877. In FIG. 17, C0, C1, and C2 denote capacitances. SC1 and SC2 denote switches for charging the capacitances C1 and C2 up to the power supply potential Vdd. SD1 and SD2 denote switches for discharging electric charges sent from the capacitances C1 and C2. ST1 and ST2 denote switches for connecting the capacitance C1 to the capacitance C0 and the capacitance C2 to the capacitance C0. t1 to t9 denote times for turning on/off switches sequentially.

When the switches SC1, ST1, and SD1 are turned on/off at the times t1, t2, and t3 sequentially, the electric charge charged in C1 up to the power supply potential Vdd is transferred to C0 and accordingly, C1 is discharged. Then, when the switches ST2 and SC2 are turned on/off at the times t4 and t5 sequentially, the electric charge in C0 is transferred to C2, and C2 is charged up to the power supply potential Vdd. When the switches ST2 and SD2 are turned on/off at t6 and t7 sequentially, the electric charge in C2 is transferred to C0, and accordingly, C2 is discharged. Then, when the switches ST1 and SC1 are turned on/off at t8 and t9 sequentially, the electric charge in C0 is transferred to C1, and accordingly, C1 is charged up to the power supply potential Vdd.

As explained above, the potential of the capacitance C1, when the logic is changed from "H" level to "L" level, and to "H" level again, allows the electric charge to be reused by transferring electric charges. When the logic is changed from "H" level to "L" level, and to "L" level, however, the switch SD1 is turned on/off at t9 instead of the switch SC1. At this time, the C1 is discharged completely, so the electric charge cannot be reused depending on the logic change. The conventional semiconductor circuit device has the above-described problem.

SUMMARY OF THE INVENTION

The present invention has been implemented to solve the above-described problems and it is an object to provide a semiconductor circuit device that is allowed to reduce the power consumption caused by charging and discharging regardless of logical changes.

According to a first aspect of the present invention, a semiconductor circuit device comprises:

a semiconductor circuit composed of a plurality of circuit devices;

a capacitance for storing an electric charge of the semiconductor circuit; and a switching circuit for connecting a power supply pin of the semiconductor circuit to a power supply or the capacitance;

wherein the switching circuit connects the power supply pin to the capacitance to store the electric charge of the semiconductor circuit in the capacitance before an input signal to the semiconductor circuit is changed, the semiconductor circuit is charged with the electric charge stored in the capacitance when the input signal is changed, and the switching circuit connects the power supply pin to the power supply to charge the semiconductor circuit after the input signal is changed.

According to a second aspect of the present invention, a semiconductor circuit device further comprises a diode connected so that the direction from an output node of the circuit device to the power supply pin is assumed as forward;

wherein the switching circuit connects the power supply pin to the capacitance before the input signal to the semiconductor circuit is changed so that the electric charge of the semiconductor circuit is stored in the capacitance through the diode.

According to a third aspect of the present invention, there is provided a semiconductor circuit device wherein the semiconductor circuit is composed of a plurality of CMOS circuit devices;

wherein the switching circuit connects the power supply pin to the capacitance before the input signal to the semiconductor circuit is changed so that the electric charge of the semiconductor circuit is stored in the capacitance through the CMOS circuit devices.

According to a fourth aspect of the present invention, a semiconductor circuit device comprises:

a first circuit block having a higher transition probability of input signal;

a second circuit block having a lower transition probability of input signal;

a first capacitance for storing an electric charge of the first circuit block;

a first switching circuit for connecting a first power supply pin of the first circuit block to the first capacitance;

a second capacitance having a capacity value smaller than that of the first capacitance and for storing an electric charge of the second circuit block; and a second switching circuit for connecting second power supply pin of the second circuit block to the power supply or the second capacitance;

wherein the first or second switching circuit connects the first or second power supply pin to the first or second capacitance to store the electric charge of the first or second circuit block in the first or second capacitance before an input signal to the first or second circuit block is changed, the first or second circuit block is charged with the electric charge stored in the first or second capacitance when the input signal is changed, the first or second switching circuit connects the first or second power supply pin to the power supply to charge the first or second circuit block after the input signal is changed.

According to a fifth aspect of the present invention, a semiconductor circuit device comprising a semiconductor circuit composed of a plurality of circuit devices, the semiconductor circuit being divided into a first circuit block and a second circuit block, the semiconductor circuit device comprises:

a capacitance for storing an electric charge of the first circuit block, the capacitance connected to a second power supply pin of the second circuit block; and a switching circuit for connecting first power supply pin of the first circuit block to a power supply or the capacitance;

wherein the switching circuit connects the first power supply pin to the capacitance to store the electric charge of the first circuit block in the capacitance before an input signal to the first circuit block is changed, the first or second circuit block is charged with the electric charge stored in the capacitance when the input signal is changed, and the switching circuit connects the first power supply pin to the power supply to charge the first circuit block after the input signal is changed.

According to a sixth aspect of the present invention, there is provided a semiconductor circuit device wherein a predetermined voltage is applied to the capacitance while the semiconductor circuit is not operating.

According to a seventh aspect of the present invention, there is provided a semiconductor circuit device wherein the second circuit block is composed of the circuit device whose threshold voltage is lower than that of the circuit device of the first circuit block.

According to an eighth aspect of the present invention, there is provided a semiconductor circuit device wherein a potential of a P-type circuit device substrate of the second circuit block is set to the same potential as that of the first capacitance.

According to a ninth aspect of the present invention, a semiconductor circuit device comprising a semiconductor circuit composed of a plurality of circuit devices, the semiconductor circuit being divided into a first circuit block and a second circuit block, the semiconductor circuit device comprises:

a first capacitance for storing an electric charge of the first circuit block;

a first switching circuit for connecting a first power supply pin of the first circuit block to a power supply or the first capacitance;

a second capacitance for storing an electric charge of the second circuit block; and a second switching circuit for connecting a second power supply pin of the second circuit block to the first or the second capacitance;

wherein the first or second switching circuit connects the first or second power supply pin to the first or second capacitance to store the electric charge of the first or second circuit block in the first or second capacitance before an input signal to the first or second circuit block is changed, the first or second circuit block is charged with the electric charge stored in the first or second capacitance when the input signal is changed, and the first switching circuit connects the first power supply pin to the power supply to charge the first circuit block and the second switching circuit connects the second power supply pin to the first capacitance to charge the second circuit block after the input signal is changed.

According to a tenth aspect of the present invention, there is provided a semiconductor circuit device wherein a predetermined voltage is applied to the first capacitance while the semiconductor circuit is not operating.

According to an eleventh aspect of the present invention, there is provided a semiconductor circuit device wherein the second circuit block is composed of the circuit device whose threshold voltage is lower than that of the circuit device of the first circuit block.

According to a twelfth aspect of the present invention, there is provided a semiconductor circuit device wherein a potential of a P-type circuit device substrate of the second circuit block is set to the same as that of the first capacitance.

DETAILED DESCRIPTION OF THE PREFERRED EMBODIMENTS

Hereunder, embodiments of the present invention will be described.

First Embodiment

Figure 1:
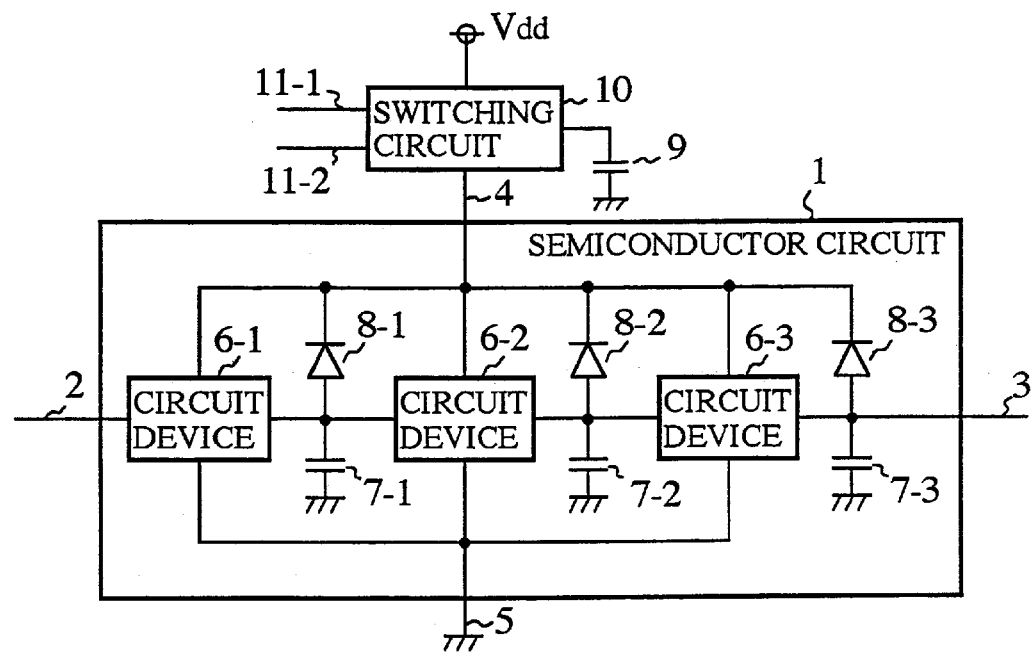
FIG. 1 is a configuration of a semiconductor circuit device in a first embodiment of the present invention.

FIG. 1 is a configuration of a semiconductor circuit device in a first embodiment of the present invention. In FIG. 1, reference numeral 1 denotes a semiconductor circuit. (In this embodiment, a 3-stage BiCMS inverter configuration is shown to simplify the explanation.) 2 denotes an input signal entered to the semiconductor circuit 1. 3 denotes an output signal output from the semiconductor circuit 1. 4 denotes a power supply pin of the semiconductor circuit 1 and 5 denotes a ground pin of the semiconductor circuit 1, connected to a ground potential. 6-1, 6-2, and 6-3 denote circuit devices forming part of the semiconductor circuit 1. 7-1, 7-2, and 7-3 denote capacitances such as interconnecting capacitance, each of which is formed between the output node of each of the circuit devices 6-1, 6-2, and 6-3 and the ground potential.

8-1, 8-2, and 8-3 denote diodes connected to the semiconductor circuit 1 so that the direction from the output node of each of the circuit devices 6-1, 6-2, and 6-3 to the power supply pin 4 is assumed as forward. 9 denotes a capacitance for forming a capacity between the ground potential and itself. 10 denotes a switching circuit connecting the power supply pin 4 to a power supply potential Vdd or the capacitance 9. 11-1 and 11-2 denote control signals for controlling the switching circuit 10.

Figure 2:
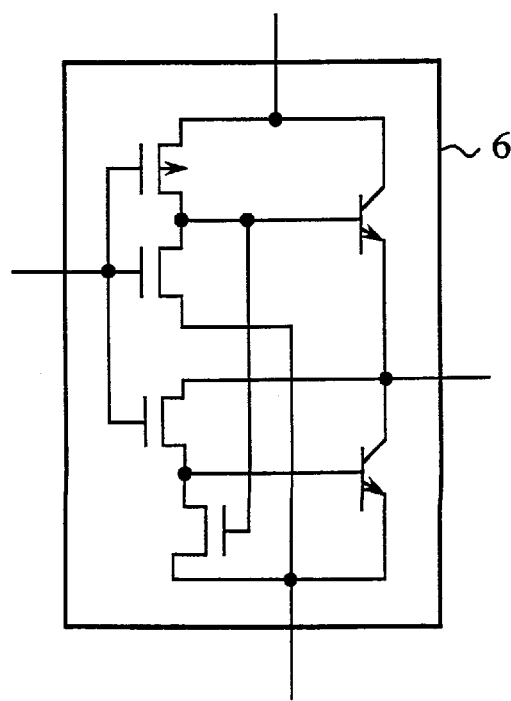
FIG. 2 is a circuit example of circuit devices in the first embodiment of the present invention.
Figure 3:
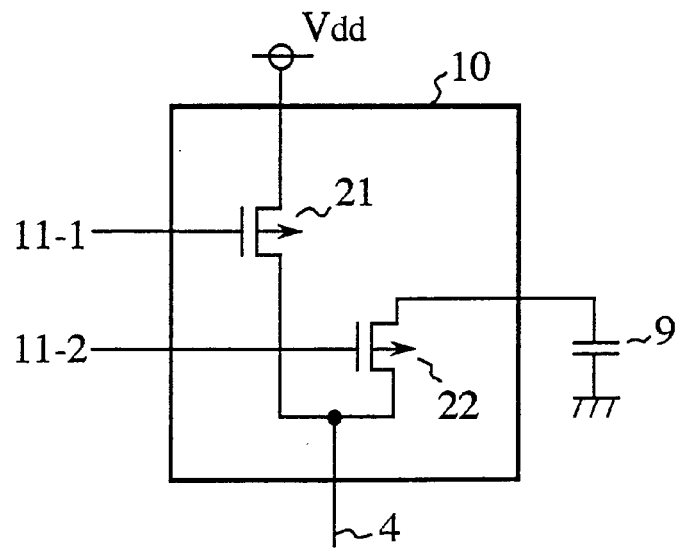
FIG. 3 is a circuit example of a switching circuit in the first embodiment of the present invention.

FIG. 2 is a circuit example of the circuit devices 6 (6-1, 6-2, and 6-3) shown in FIG. 1. Each circuit device 6 is a BiCMDS inverter having one input and one output. FIG. 3 is a circuit example of the switching circuit 10 shown in FIG. 1. 21 denotes a P-type transistor having a source connected to the power supply potential Vdd, a drain connected to the power supply pin 4, and a gate connected to the control signal 11-1 respectively. 22 denotes a P-type transistor having a source connected to the capacitance 9, a drain connected to the power supply pin 4, and a gate connected to the control signal 11-2 respectively.

Next, the operation of the semiconductor circuit device will be explained.

Figure 4:
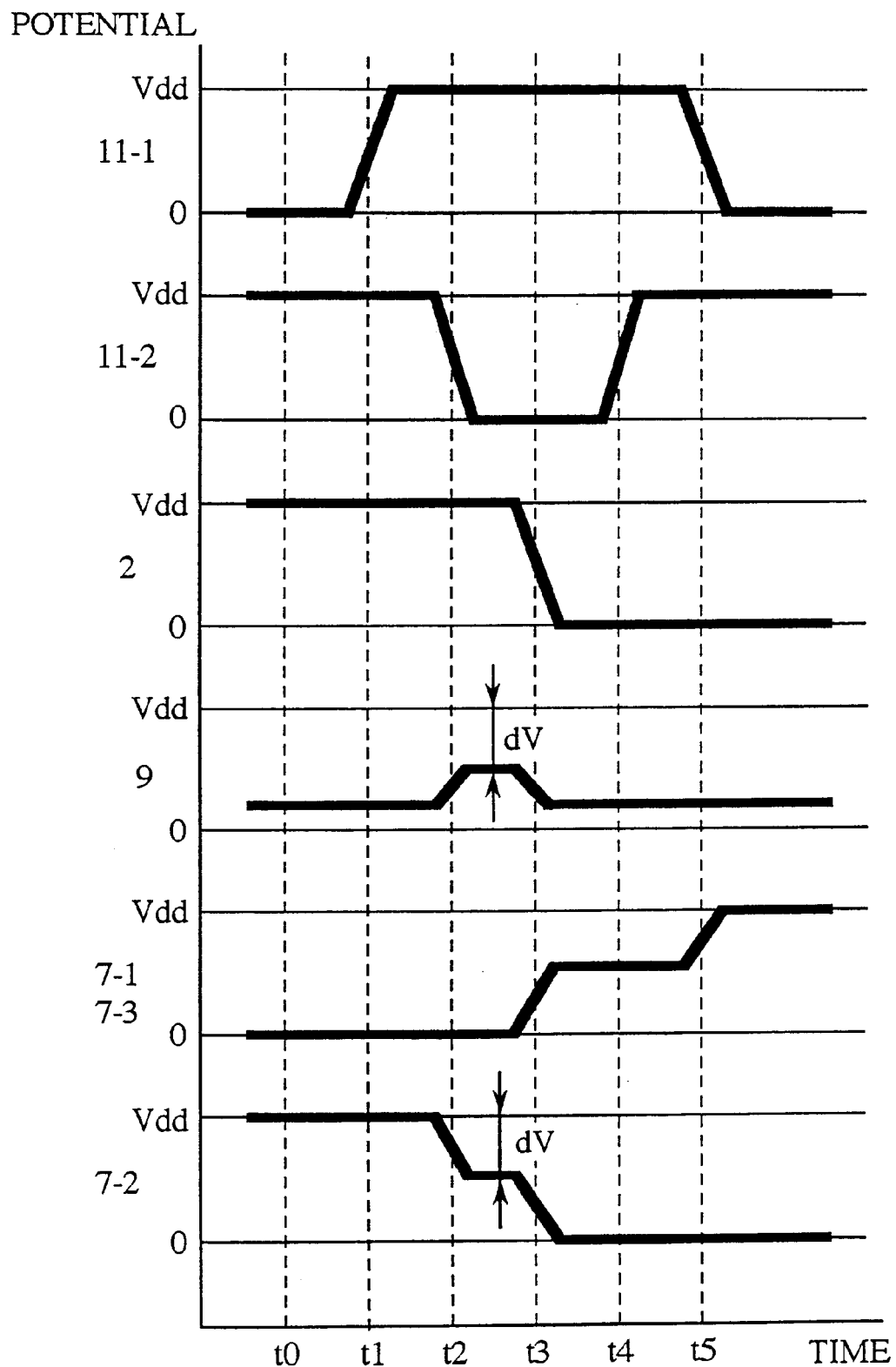
FIG. 4 is a timing chart for each portion of the semiconductor device in the first embodiment of the present invention.

FIG. 4 is a timing chart for each portion in the semiconductor circuit 1 shown in FIG. 1. The control signals 11-1 and 11-2 are entered to the switching circuit 10 periodically at the timing shown in FIG. 4. The input signal 2 is entered to the semiconductor circuit 1 at a timing of the time t3. In the steady state of the time t0, the control signal 11-1 is at "L" level and the control signal 11-2 is at "H" level. The input signal 2 is assumed to be "H" in this embodiment. At this time, the potential of the capacitances 7-1 and 7-3 is charged to "L" level and the potential of the capacitance 7-2 is charged to "H". The potential of the capacitance 9 is undefined.

At first, the control signal 11-1 is changed to "H" level at the time t1 and the power supply pin 4 is disconnected from the power supply. Then, the control signal 11-2 is changed to "L" level at the time t2 and the power supply pin 4 is connected to the capacitance 9. The output node of the circuit device 6-2 is connected to the capacitance 9 through the diode 8-2 and the P-type transistor 22 provided in the switching circuit 10, so the potential of the capacitance 7-2 is reduced by dV from the power supply potential Vdd, while the potential of the capacitance 9 is increased by a value corresponding to dV. Thus, the potential of the capacitance 9 becomes the same as the potential (Vdd–dV) of the capacitance 7-2. The dV value is decided by the capacity ratio of the capacitance 7-2 to the capacitance 9.

And, when the input signal 2 is changed from "H" level to "L" level at the time t3, the electric charge that has been charged in the capacitance 7-2 is discharged by the circuit device 6-2. Thus, the potential of the capacitance 7-2 becomes "L" level. At this time, the diode 8-2 prevents the electric charge in the capacitance 9 from being discharged. On the other hand, the capacitances 7-1 and 7-3 are charged by the circuit devices 6-1 and 6-3 respectively. Since the control signal 11-1 is at "H" level and the control signal 11-2 is at "L" level, however, the power supply pin 4 is connected to the capacitance 9. Thus, the electric charge used for charging is the electric charge that has been stored in the capacitance 9, not the electric charge from the power supply potential Vdd. And accordingly, the potential of the capacitance 9 is lowered and the potential of the power supply pin 4 takes a value smaller than (Vdd–dV). How much the potential of the capacitance 9 is to be lowered is decided by the capacity ratio of the capacitance obtained by the total of the capacitances 7-1 and 7-2 to the capacitance 9.

Thereafter, when the control signal 11-2 is changed to "H" level at the time t4 and the control signal 11-1 is changed to "L" level at the time t5 respectively, the power supply pin 4 is connected to the power supply and the capacitances 7-1 and 7-2 are further charged by the circuit devices 6-1 and 6-3 up to the power supply potential Vdd. As described above, the electric charge of the capacitance 7-2 is enough to be able to charge the capacitances 7-1 and 7-3, so that the electric charge can be reused.

Figure 5:
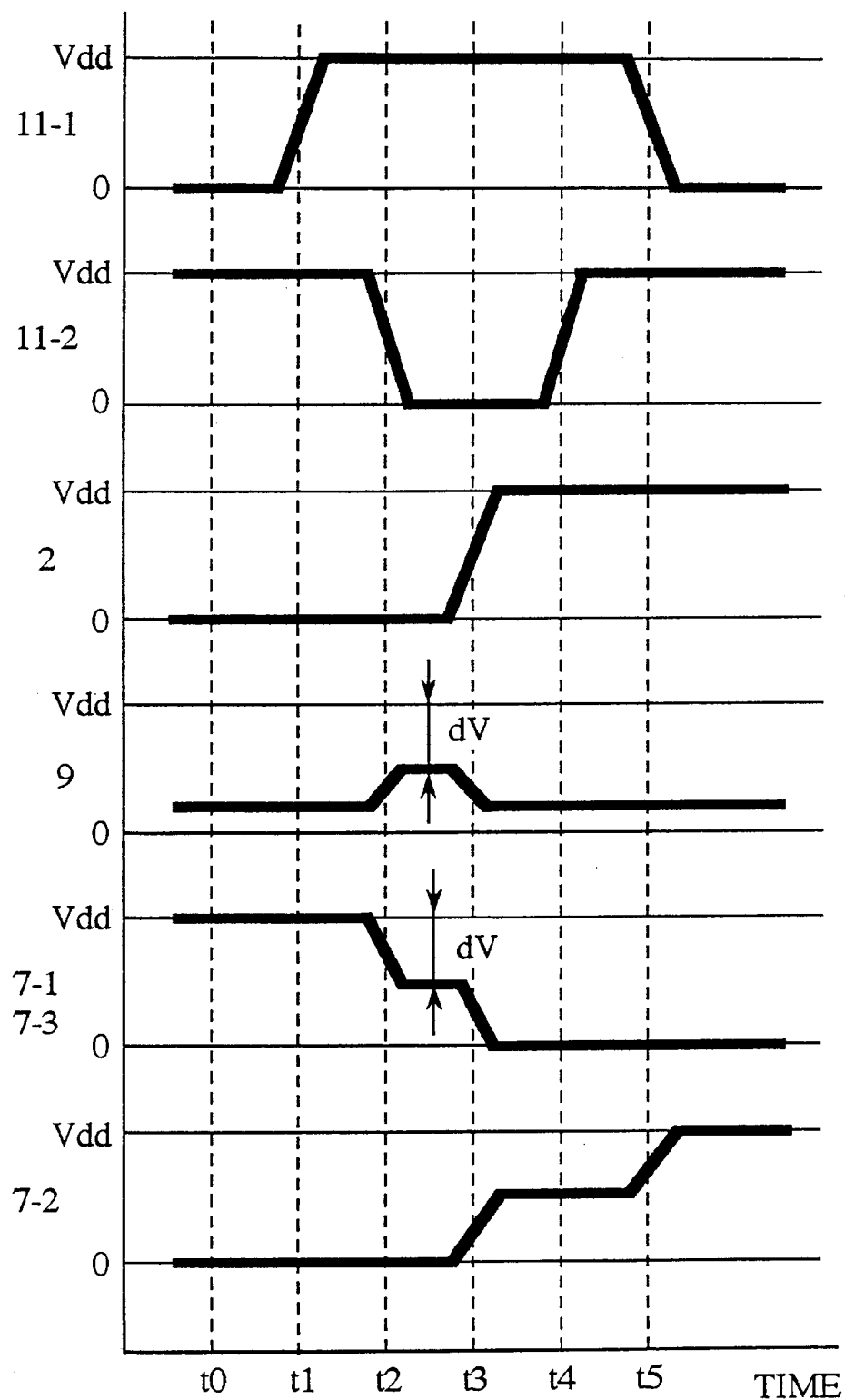
FIG. 5 is a timing chart for each portion of the semiconductor circuit device in the first embodiment of the present invention.

FIG. 5 is a timing chart indicating the change of the input signal 2 from "L" level to "H" level at the time t3. When the control signal 11-2 is changed from "H" level to "L" level at the time t2, the capacitance 9 is charged with the electric charge of the capacitances 7-1 and 7-3, so that the power supply potential Vdd is reduced only by dV and the potential of the capacitance 9 is increased by a value corresponding to dV and becomes the same as the potential (Vdd–dV) of the capacitances 7-1 and 7-3. When the input signal 2 is changed from "L" level to "H" level at the time t3, the electric charge of the capacitances 7-1 and 7-3 is discharged by the circuit devices 6-1 and 6-3. On the other hand, the capacitance 7-2 is charged with the electric charge of the capacitance 9. And, when the control signal 11-1 is changed from "H" level to "L" level at the time t5, the capacitance 9 is further charged up to the power supply potential Vdd. Even if the input signal 2 is changed from "L" level to "H" level, the electric charge can thus be reused as explained above.

Figure 6:
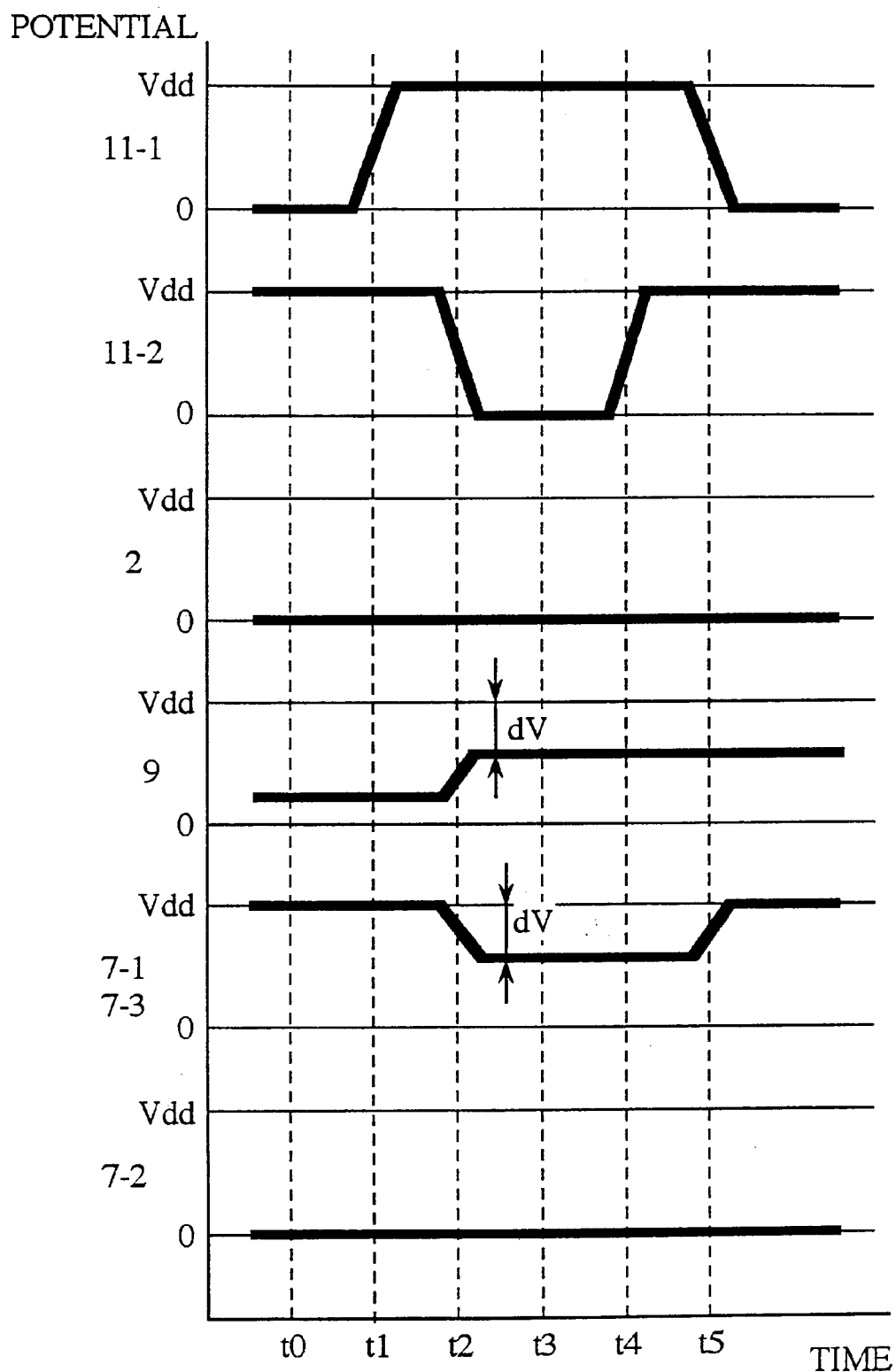
FIG. 6 is a timing chart for each portion of the semiconductor circuit device in the first embodiment of the present invention.

FIG. 6 is a timing chart for a case that the input signal 2,is not changed from "L" level to "H" level at the time t3, but the potential is kept at "L" level. Since the input signal 2 is not changed at the time t3, the capacitance 7-2 is not charged with the electric charge of the capacitance 9, so the potential of the capacitances 7-1, 7-2, 7-3, and 9 is not changed. At the time t5, the capacitances 7-1 and 7-3 are charged up to the power supply potential Vdd when the control signal 11-1 is changed from "H" level to "L" level. In this case, since the electric charge is not discharged wastefully from the capacitances 7-1, 7-3, and 9, the electric charge can be reused when the input signal 2 is changed next time. In this way, the problem of JP-A No. Hei 7-141877 as the prior art can be solved.

In this,embodiment, the time t2 may be the same as the time t1 and the time t4 may be the same as the time t5. In other words, the control signal 11-2 may be an inversion signal of the control signal 11-1. Furthermore, although the diode is connected to every output node of the circuit device 6 in this embodiment, a node connected to the capacitance 7 having a larger capacity is selected and the selected node only may be connected to the diode.

As explained above, according to this first embodiment, the electric charge corresponding to dV among electric charge that has been charged up to the power supply potential Vdd is used for charging another nodes through the capacitance 9 when a signal is changed, so it is possible to obtain an effect that the power consumption of the semiconductor circuit device can be reduced significantly when the circuit is operating.

Second Embodiment

Figure 7:
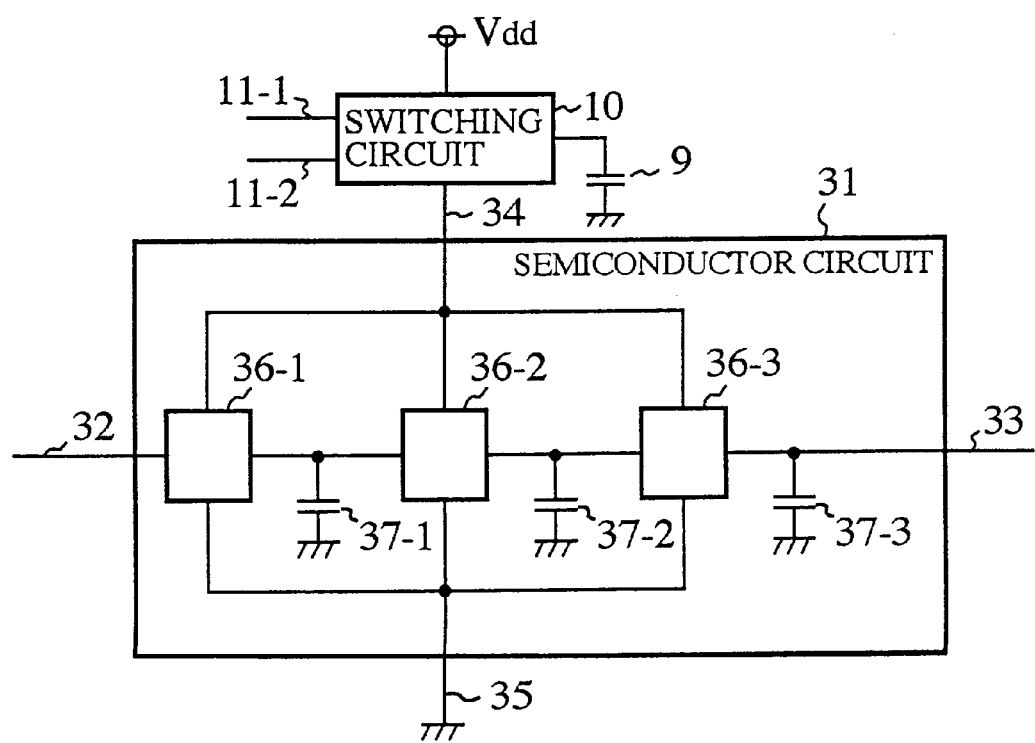
FIG. 7 is a configuration of a semiconductor circuit device in a second embodiment of the present invention.
Figure 8:
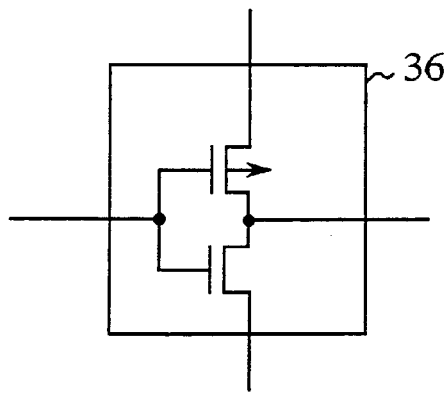
FIG. 8 is a circuit example of circuit devices in the second embodiment of the present invention.

FIG. 7 is a configuration of a semiconductor circuit device in a second embodiment of the present invention. In FIG. 7, 31 denotes a CMOS semiconductor circuit. (In this embodiment, a 3-stage CMOS inverter configuration is shown to simplify the explanation.) 32 denotes an input signal entered to the semiconductor circuit 31 and 33 denotes an output signal output from the semiconductor circuit 31. 34 denotes a power supply pin of the semiconductor circuit 31 and 35 denotes a ground pin of the semiconductor circuit 31, connected to a ground potential. 36-1, 36-2, and 36-3 are CMOS circuit devices (circuit devices) forming part of the semiconductor circuit 31. 37-1, 37-2, and 37-3 are capacitances such as interconnecting capacitance formed between the output node of each of the CMOS circuit devices 36-1, 36-2, and 36-3 and the ground potential respectively. Other elements are the same as those shown in FIG. 1. FIG. 8 is a circuit example of the CMOS circuit devices 36 (36-1, 36-2, and 36-3) shown in FIG. 7. The circuit is a CMOS inverter having one input and one output.

Next, the operation of the circuitry will be explained.

Control signals 11-1 and 11-2 as well as the input signal 32 are entered in the same way as in the first embodiment. Although a diode 8 (8-1, 8-2, and 8-3) is used to transfer the electric charge of a capacitance charged up to the power supply potential to the capacitance 9 in the first embodiment, no diode is used for such a purpose in this embodiment. This is because, for example, the potential of the input side of the CMOS circuit device 36-2 is at "L" level and the electric charge in the capacitance 37-2 is transferred to the capacitance 9 through a P-type transistor of the CMOS circuit device 36-2.

Even if the CMOS circuit devices 36-1, 36-2, and 36-3 are CMOS NAND and CMOS NOR circuits adopted instead of CMOS inverter circuits, it is apparent that no diode is needed unlike the first embodiment. Furthermore, just like in the first embodiment, the control signal 11-2 may be an inversion signal of the control signal 11-1.

As explained above, according to this second embodiment, it is possible to obtain an effect that the power consumption needed for operating the semiconductor circuit device can be reduced significantly, since part of the electric charge that has been charged up to the power supply potential Vdd is used for charging other nodes through the capacitance 9 when a signal is changed.

Third Embodiment

Figure 9:
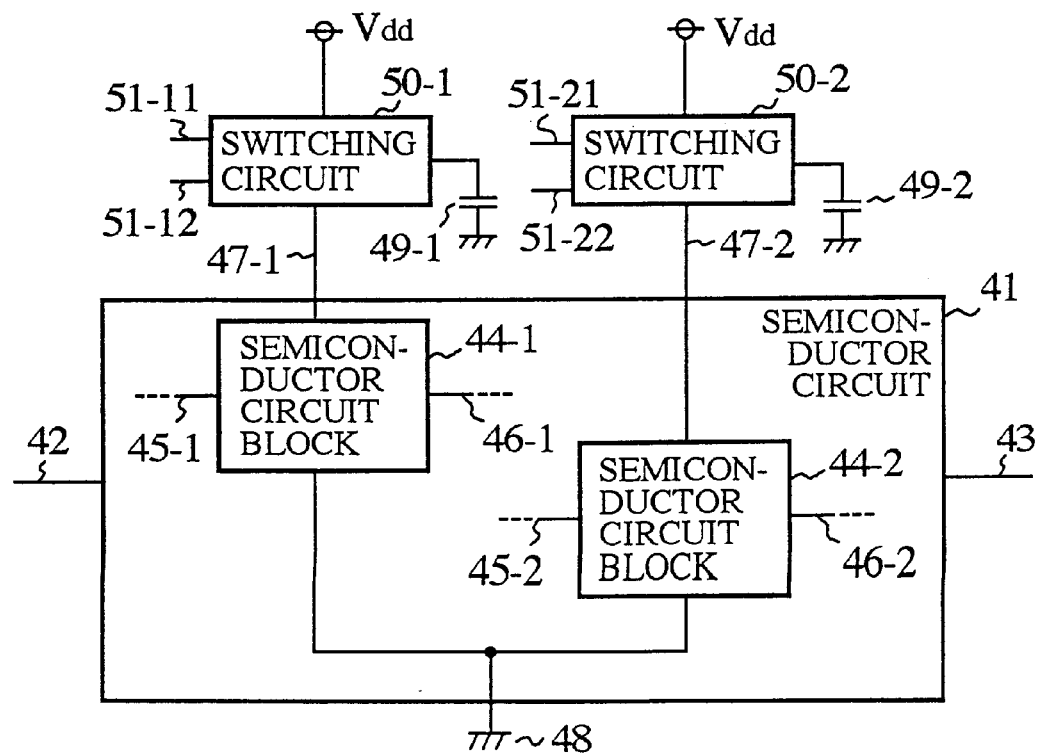
FIG. 9 is a configuration of a semiconductor circuit device in a third embodiment of the present invention.

FIG. 9 is a configuration of a semiconductor circuit device in a third embodiment of the present invention. In FIG. 9, 41 denotes a semiconductor circuit, 42 denotes an input signal entered to the semiconductor circuit 41, and 43 denotes an output signal output from the semiconductor circuit 41. 44-1 and 44-2 denote semiconductor circuit blocks (first and second circuit blocks), each of which is part of the semiconductor circuit 41 and composed of some circuit devices. 45-1 and 45-2 denote input signals entered to the semiconductor circuit blocks 44-1 and 44-2 respectively, and 46-1 and 46-2 denote output signals output from the semiconductor circuit blocks 44-1 and 44-2 respectively. 47-1 and 47-2 denote power supply pins (first and second power supply pins) of the semiconductor circuit blocks 44-1 and 44-2 respectively. 48 denotes a ground pin of the semiconductor circuit blocks 44-1 and 44-2 connected to a ground potential commonly.

49-1 and 49-2 denote capacitances (first and second capacitances) for forming a capacity between the ground potential and itself respectively. 50-1 and 50-2 denote switching circuits (first and second switching circuits) connecting the power supply pins 47-1 and 47-2 to the power supply potential Vdd or the capacitances 49-1 and 49-2 respectively. 51-11 and 51-12 denote control signals for controlling the switching circuit 50-1. 51-21 and 51-22 denote control signals for controlling the switching circuit 50-2. The semiconductor circuit blocks 44-1 and 44-2 may take any circuit configuration of the semiconductor circuit 1 shown in FIG. 1 and the semiconductor circuit 31 shown in FIG. 7. The circuit example of the switching circuits 50-1 and 50-2 is the same as that shown in FIG. 3.

Next, the operation of the semiconductor circuit device will be explained.

Figure 10:
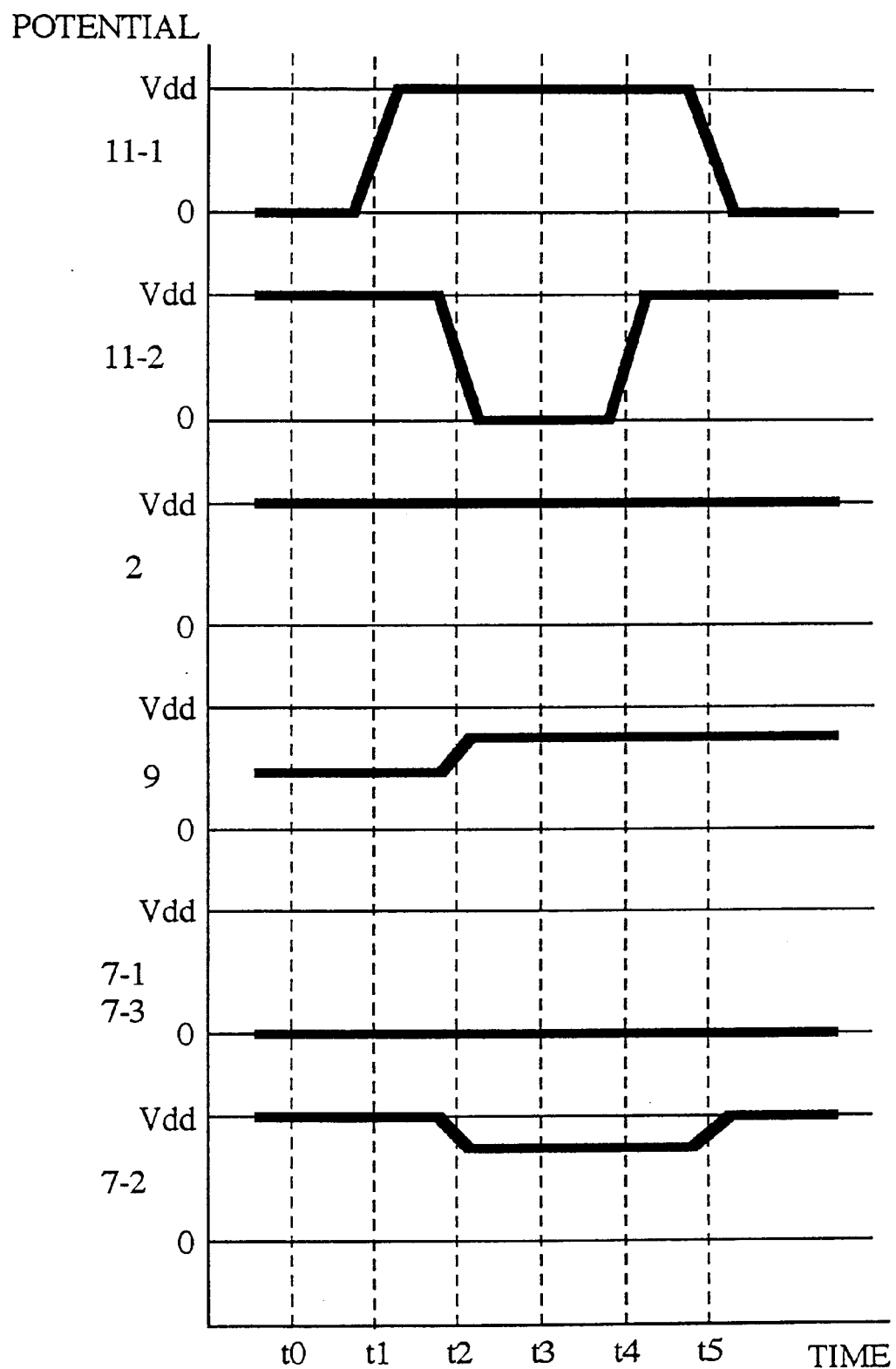
FIG. 10 is a timing chart for each portion of the semiconductor circuit device in the first embodiment of the present invention.

Explanation will be made here for the operation in which the input signal 2 is not changed at the time t3 shown in FIG. 4 in the first embodiment with reference to FIG. 10. Control signals 11-1 and 11-2 are entered in the same way as shown in FIG. 4. When the control signal 11-2 is changed from "H" level to "L" level at the time t2, part of the electric charge in the capacitance 7-2 is transferred to the capacitance 9 through the diode 8-2 and the P-type transistor 22 provided in the switching circuit 10.

When the control signal 11-1 is changed from "H" level to "L" level at the time t5, the potential of the lowered capacitance 7-2 is charged up to the potential of "H" level. In other words, unless the input signal 2 is changed, the capacitance 9 is just charged in one cycle of the circuit operation and the electric charge is not reused. When the capacitance 9 has a large capacity, charging of the capacity of the capacitance 9 is just repeated independently of the circuit operation itself. Thus, the capacity of the capacitance 9 should be small as long as the input signal 2 is not changed.

On the other hand, when the input signal 2 is changed just as shown in FIG. 4, if the capacity of the capacitance 9 is increased, the potential at the times t0 and t1 is lowered respectively. In other words, the dV value is increased and the power consumption of the circuit operation is reduced. If the transition probability of the input signal 45-1 is higher than that of the input signal 45-2 in FIG. 9, that is, when a changing probability is high, the power consumption can thus be reduced effectively by making larger the capacity of the capacitance 49-1 than that of the capacitance 49-2.

The control signals 51-11 may be the same as the control signals 51-21 and the control signals 51-12 may be the same as the control signals 51-22 in this embodiment. And, just like in the first embodiment, the control signals 51-12 and 51-22 may be inversion signals of the control signals 51-11 and 51-21. Furthermore, although the semiconductor circuit 41 is divided into two blocks, the circuit 41 may also be divided into more blocks and controlled independently of others.

As explained above, according to this third embodiment, it is possible to obtain an effect that the power consumption can be reduced effectively by dividing the semiconductor circuit block into the circuit block having the high transition probability and the circuit block having the low transition probability according to the circuit configuration and providing each of those blocks with a proper capacitance.

Fourth Embodiment

Figure 11:
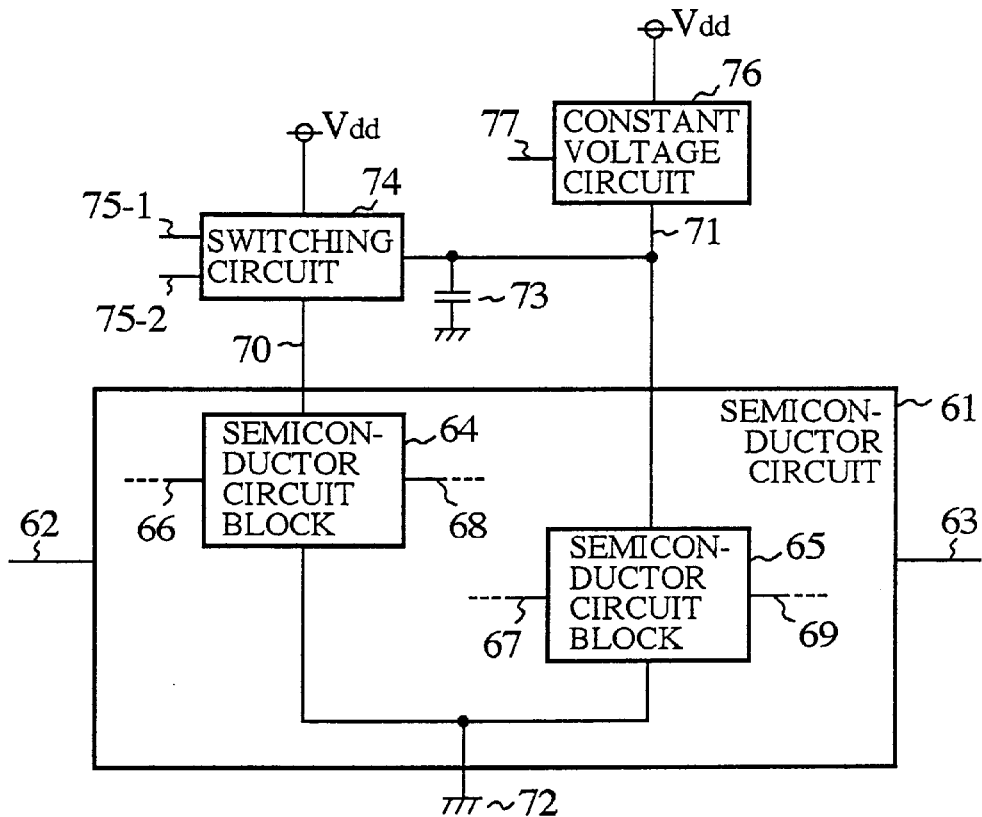
FIG. 11 is a configuration of a semiconductor circuit device in a fourth embodiment of the present invention.

FIG. 11 is a configuration of a semiconductor circuit device in a fourth embodiment of the present invention. In FIG. 11, 61 denotes a semiconductor device and 62 denotes an input signal entered to the 61, and 63 denotes an output signal output from the 61. 64 and 65 denote semiconductor circuit blocks (first and second circuit blocks), each of which is part of the 61. 66 and 67 denote input signals entered to the semiconductor circuit blocks 64 and 65 respectively, and 68 and 69 denote output signals output from the semiconductor circuit blocks 64 and 65 respectively. 70 and 71 denote power supply pins (first and second power supply pins) of the semiconductor circuit blocks 64 and 65 respectively. 72 denotes a ground pin of the semiconductor circuit blocks 64 and 65 connected to a ground potential commonly.

73 denotes a capacitance for forming a capacity between the ground potential and itself. 74 denotes a switching circuit connecting the power supply pin 70 to the power supply potential Vdd or the capacitance 73 which is connected to the power supply pin 71. 75-1 and 75-2 denote control signals for controlling the switching circuit 74. 76 denotes a constant voltage circuit for receiving power from the power supply and outputting the power supply potential Vdd or an intermediate potential between the power supply potential Vdd and the ground potential. 77 denotes a sleep signal for controlling the constant voltage circuit 76.

Figure 12:
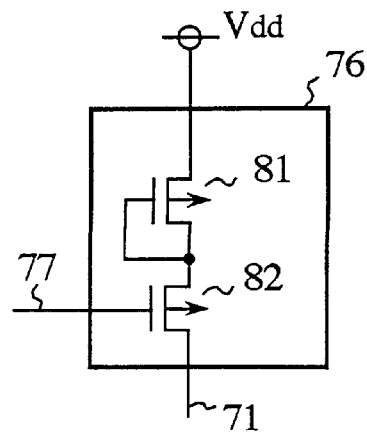
FIG. 12 is a circuit example of a constant voltage circuit in the fourth embodiment of the present invention.

The semiconductor circuit block 64 may be any of the circuit configurations of the semiconductor circuit 1 shown in FIG. 1 and the semiconductor circuit 31 shown in FIG. 7. The semiconductor circuit block 65 is a conventional semiconductor circuit such as a BiCMOS circuit and a CMOS circuit. The circuit example of the switching circuit 74 is the same as that shown in FIG. 3. FIG. 12 denotes a circuit example of the constant voltage circuit 76. 81 denotes a P-type transistor having a source connected to the power supply and having a drain and a gate short-circuited. 82 denotes a P-type transistor having a source connected to the drain of the P-type transistor 81, a drain connected to the power supply pin 71, and a gate connected to the sleep signal 77 respectively.

Next, the operation of the circuitry will be explained.

Figure 13:
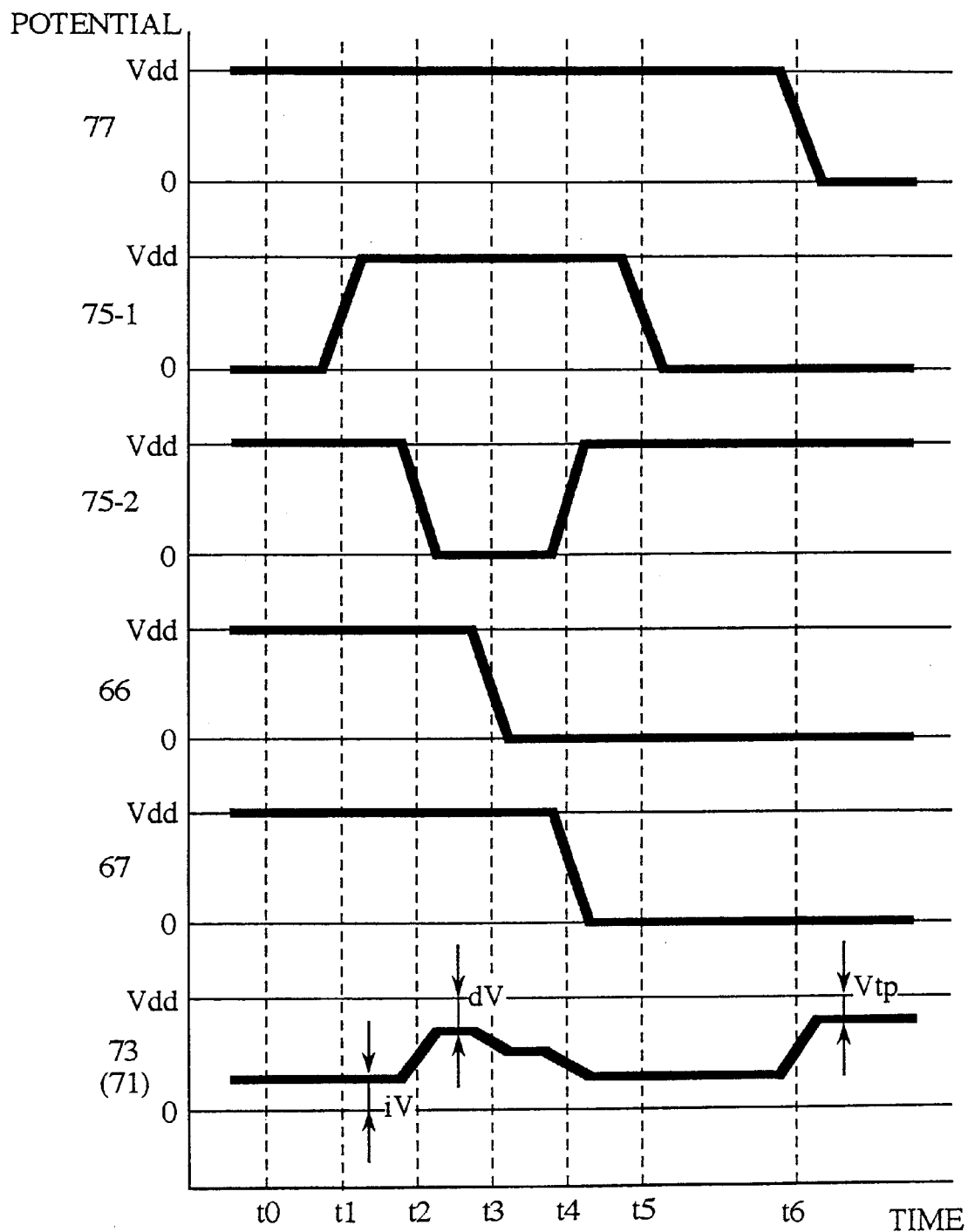
FIG. 13 is a timing chart for each portion of the semiconductor circuit device in the fourth embodiment of the present invention.

FIG. 13 is a timing chart for each portion of the semiconductor circuit device shown in FIG. 11. While the circuit is operating, the sleep signal 77 is at "H" level. When the control signal 75-2 is changed to "L" level at the time t2, the electric charge that has been stored in a capacitance inside the semiconductor circuit block 64 is transferred to the capacitance 73, so that the potential of the capacitance 73 is raised. When the input signal 66 is changed from "H" level to "L" level at the time t3, an electric charge is distributed between the capacitance in the semiconductor circuit block 64 and the capacitance 73, so the potential of the capacitance 73 is lowered. At this time, how much the potential of the capacitance 73 is to be lowered is decided by the capacity ratio of the capacitance in the semiconductor circuit block 64 to the capacitance 73.

When the input signal 67 is changed from "H" level to "L" level at the time t4, an electric charge is divided between the capacitance in the semiconductor circuit block 65 and the capacitance 73, so the potential of the capacitance 73 is furthermore lowered. At this time, how much the potential of the capacitance 73 is to be lowered is decided by the capacity ratio of the capacitance in the semiconductor circuit block 65 to the capacitance 73. The smaller the iV value is, that is, the larger the dV value is, the higher the efficient of reusing the electric charge in the semiconductor circuit block 64 becomes. In FIG. 11, since the electric charge in the capacitance 73 is also used for operating the semiconductor circuit block 65, many discharging circuits are used in comparison with those in FIGS. 1 and 7, so that the iV value becomes small. Consequently, it is possible to reduce the power consumption of the semiconductor circuit more significantly. The iV value denotes a potential when the input signal 62 is stable after a few cycles of potential changes.

When sleeping, that is, when the control signals 75-1 and 75-2, as well as the input signals 66 and 67 are not changed, the sleep signal 77 is at "L" level and the P-type transistor 82 shown in FIG. 12 is turned on, so the potential of the power supply pin 71, that is, the potential of the capacitance 73 is fixed to Vdd–Vtp. The Vtp is the threshold voltage of the P-type transistor 81. If a memory is provided in the semiconductor circuit block 65, then the data stored in the memory can be held as it is by supplying a specified potential to the power supply pin 71 of the semiconductor circuit block 65 during sleeping.

Since the semiconductor circuit block 65 can operate with a potential lower than the power supply potential, that is, only with the potential of the capacitance 73, the power consumption can be reduced, but the circuit operation becomes slow. Consequently, the semiconductor circuit block 64 can be used for a block to be operated at a high speed and the semiconductor circuit block 65 can be used for a block permitted to be operated at a low speed. The problem that the circuit operation becomes slow can be solved by lowering the threshold voltage of the transistor used for the semiconductor circuit block 65 more than that of the transistor used for the semiconductor circuit block 64 or by using the potential as low as that of the capacitance 73 as the potential of the P-type transistor substrate (potential given to the N-type board) provided in the semiconductor circuit block 65 instead of the power supply potential Vdd.

Although FIG. 13 shows a case that the input signal 67 is changed at the time t4, the same effect can be obtained any time the input signal 67 is changed. In other words, the semiconductor circuit block 64 and the semiconductor circuit block 65 may be operated independently of each other.

As explained above, according to this fourth embodiment, part of the electric charge that has been charged up to the power supply potential Vdd is used for charging other nodes through the capacitance 73 and the other circuit block that uses the capacitance 73 as a power supply when a signal is changed, it is possible to obtain an effect that the power consumption can be reduced more significantly during circuit operation.

Fifth Embodiment

Figure 14:
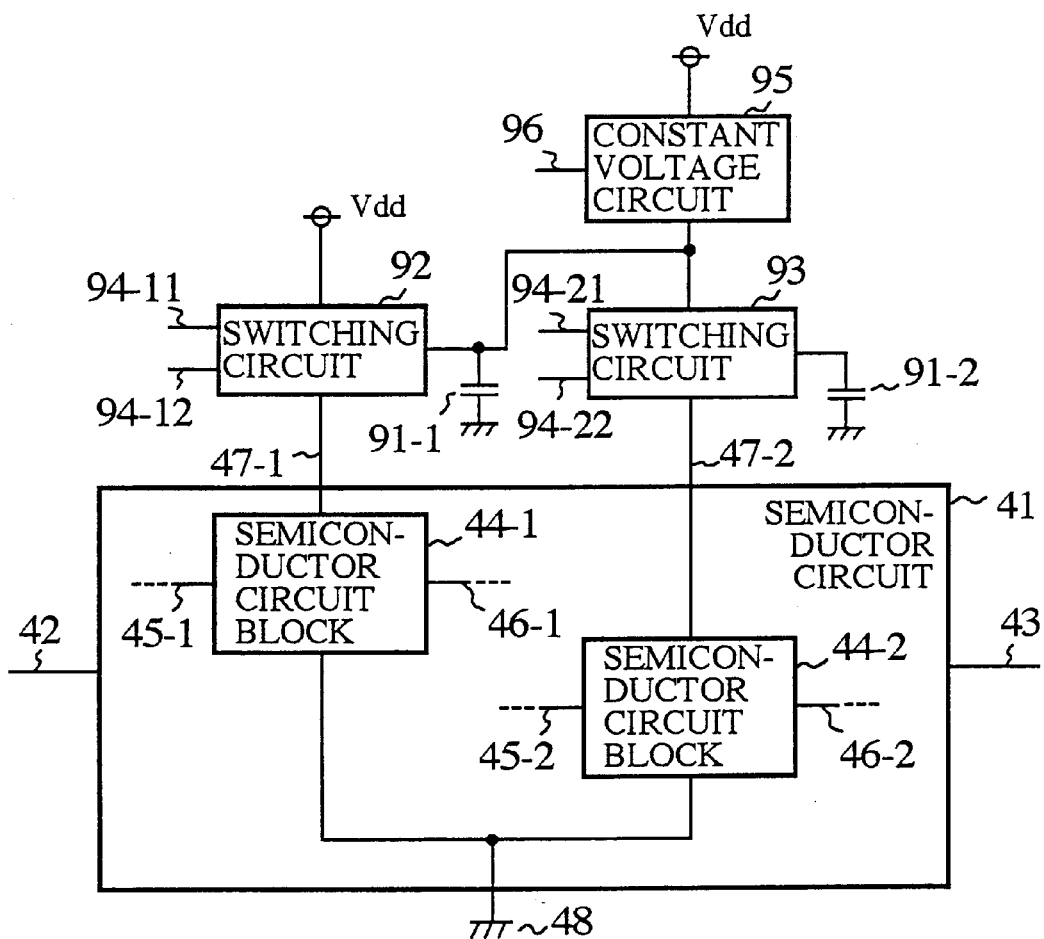
FIG. 14 is a configuration of a semiconductor circuit device in a fifth embodiment of the present invention.

FIG. 14 is a configuration of a semiconductor circuit device in a fifth embodiment of the present invention. In FIG. 14, 91-1 and 91-2 denote capacitances (first and second capacitances) for forming a capacity between a ground potential and itself respectively. 92 denotes a switching circuit (a first switching circuit) connecting the power supply pin 47-1 to the power supply potential Vdd or the capacitance 91-1. 93 denotes a switching circuit (a second switching circuit) connecting the power supply pin 47-2 to the capacitance 91-1 or 91-2. 94-11 and 94-12 denote control signals for controlling the switching circuit 92 and 94-21 and 94-22 are control signals for controlling the switching circuit 93. 95 denotes a constant voltage circuit for receiving power from the power supply and outputting the power supply potential Vdd or an intermediate potential between the power supply potential Vdd and the ground potential. 96 denotes a sleep signal for controlling the constant voltage circuit 95. Other elements are the same as those shown in FIG. 9. The circuit example of the switching circuits 92 and 93 is the same as that shown in FIG. 3 and the circuit example of the constant voltage circuit 95 is the same as that shown in FIG. 12.

Next, the operation of the circuit will be explained.

Figure 15:
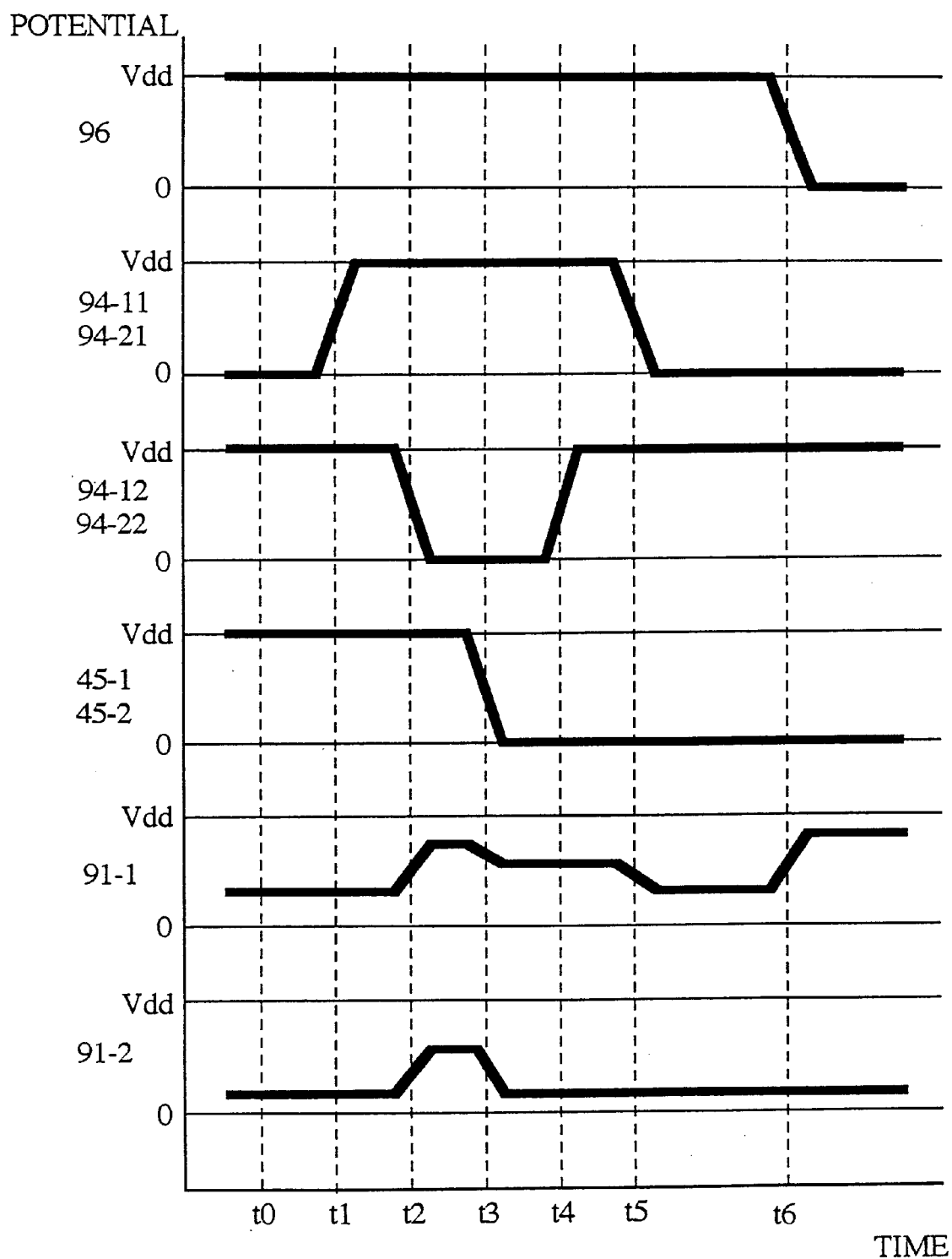
FIG. 15 is a timing chart for each portion of the semiconductor circuit device in the fifth embodiment of the present invention.
Figure 16:
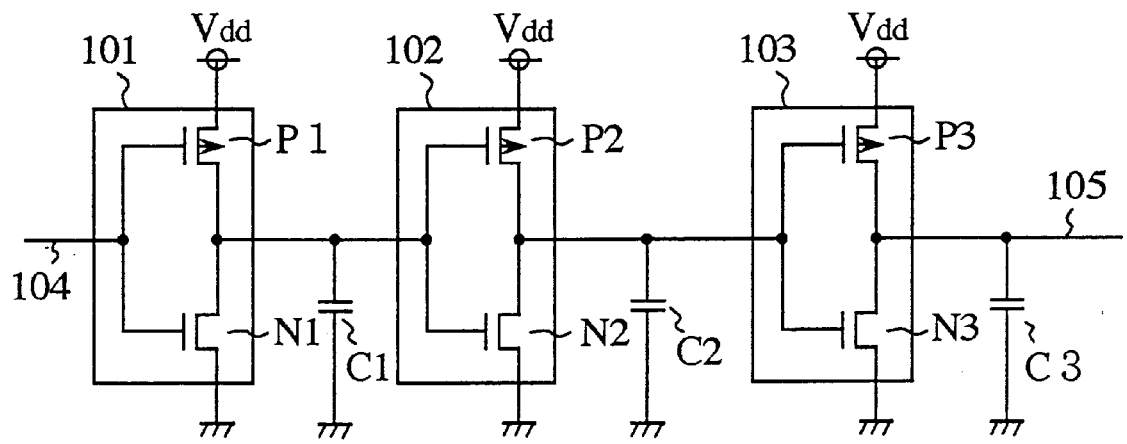
FIG. 16 is a configuration of the conventional semiconductor circuit device.
Figure 17:
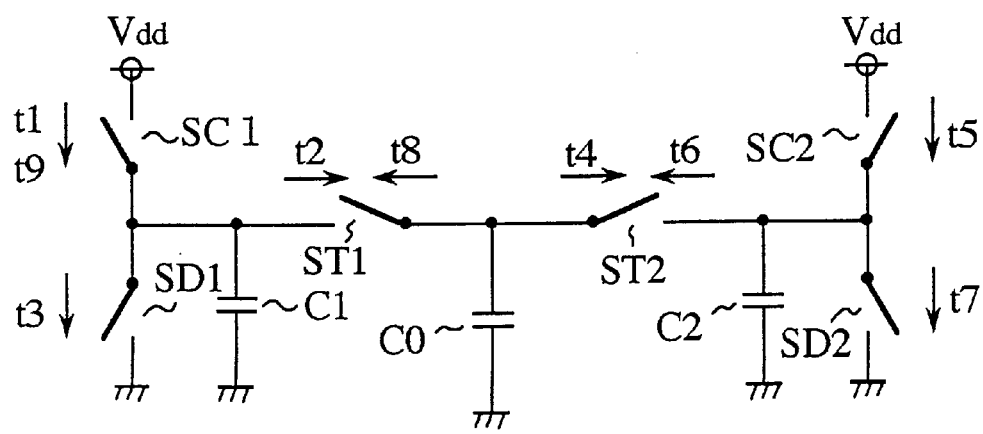
FIG. 17 is a configuration of the conventional concept for recycling of electric charge.

FIG. 15 is a timing chart for each portion of the semiconductor circuit device shown in FIG. 14. While the circuit is operating, the sleep signal 96 is at "H" level. When the control signals 94-12 and 94-22 are changed to "L" level at the time t2, the electric charge that has been stored in the semiconductor circuit blocks 44-1 and 44-2 is transferred to the capacitances 91-1 and 91-2 respectively, so that the potential of the capacitances 91-1 and 91-2 is raised. When the input signals 45-1 and 45-2 are changed at the time t3, an electric charge is distributed between the capacitances in the semiconductor circuit blocks 44-1 and 44-2 and capacitances 91-1 and 91-2, so that the potential of the capacitances 91-1 and 91-2 is lowered. How much the potential of the capacitances 91-1 and 91-2 is to- be lowered at this time is decided by the capacity ratio of the capacitance in the semiconductor circuit block 44-1 to the capacitance 91-1 and the capacity ratio of the capacitance of the semiconductor circuit block 44-2 to the capacitance 91-2.

When the control signals 94-11 and 94-21 are changed to "L" level at the time t5, the potential of the power supply pin 47-1 of the semiconductor circuit block 44-1 becomes the same as the power supply potential Vdd, and the potential of the power supply pin 47-2 of the semiconductor circuit block 44-2 is connected to the potential of the capacitance 91-1, so that an electric charge is distributed between the capacitance in the semiconductor circuit block 44-2 and the capacitance 91-1. Thus, the potential of the capacitance 91-1 is further lowered.

While sleeping, the sleep signal 96 is at "L" level, and the potential of the power supply pin 47-2 (potential of the capacitance 91-1) is fixed to Vdd−Vtp. If a memory is provided in the semiconductor circuit block 44-2, the data in the memory is held as it is at this time.

Although FIG. 15 shows a case that both the semiconductor circuit block 44-1 and the semiconductor circuit block 44-2 are controlled concurrently, each of those blocks may be operated independently of each other.

Also in this embodiment, the semiconductor circuit block 44-2 can be operated with a potential lower than that of the power supply, that is, only with the potential of the capacitance 91-1, so the power consumption of the circuit device is reduced, but the operation of the circuit becomes slow. Thus, just like in the fourth embodiment, the semiconductor circuit block 44-1 can be used for a block to be operated at a high speed and the semiconductor circuit block 44-2 can be used for a block permitted to be operated at a low speed. The problem that the circuit operation becomes slow can also be solved by the same method as that of the fourth embodiment.

As explained above, according to this fifth embodiment, part of the electric charge that has been charged in the semiconductor circuit block 44-1 up to the power supply potential Vdd is used for charging other nodes in the semiconductor circuit block 44-1 through the capacitance 91-1 and for charging the other semiconductor circuit block 44-2 that uses the capacitance 91-1 as a power supply when a signal is changed. Furthermore, part of the electric charge that has been charged in the semiconductor circuit block 44-2 is used for charging other nodes in the semiconductor circuit block 44-2. Thus, it is possible to obtain an effect that the power consumption can be reduced significantly while the circuit is operating.

As explained above, according to the present invention, the electric charge that has been charged up to the power supply potential in the semiconductor circuit is used for charging other nodes through a capacitance when a signal is changed, so it is possible to obtain an effect that the power consumption can be reduced significantly when the circuit is operating.

According to the present invention, a semiconductor circuit is divided into a circuit block having a high transition probability and a circuit block having a low transition probability according to the circuit configuration and each circuit block has a proper capacitance, so it is possible to obtain an effect that the power consumption can be reduced effectively whether an input signal is changed or not changed.

According to the present invention, an electric charge that has been charged up to a power supply potential in one circuit block is used for charging other nodes through a capacitance and for charging the other circuit block that uses the capacitance as a power supply when a signal is changed, so it is possible to obtain an effect that the power consumption can be reduced significantly while the circuit is operating.

What is claim is:

1. A semiconductor circuit device, comprising:
    a semiconductor circuit composed of a plurality of circuit devices;
    a capacitance for storing an electric charge of said semiconductor circuit; and
    a switching circuit for connecting a power supply pin of said semiconductor circuit to a power supply or said capacitance;
    wherein said switching circuit connects said power supply pin to said capacitance to store the electric charge of said semiconductor circuit in said capacitance before an input signal to said semiconductor circuit is changed, said semiconductor circuit is charged with the electric charge stored in said capacitance when said input signal is changed, and said switching circuit subsequently disconnects said power supply pin from said capacitance and connects said power supply pin to said power supply to further charge said semiconductor circuit after said input signal is changed.

2. A semiconductor circuit device according to claim 1, further comprising a diode connected so that the direction from an output node of said circuit device to said power supply pin is assumed as forward;
    wherein said switching circuit connects said power supply pin to said capacitance before said input signal to said semiconductor circuit is changed so that the electric charge of said semiconductor circuit is stored in said capacitance through said diode.

3. A semiconductor circuit device according to claim 1, wherein said plurality of circuit devices comprise a plurality of CMOS circuit devices;

wherein said switching circuit connects said power supply pin to said capacitance before said input signal to said semiconductor circuit is changed so that the electric charge of said semiconductor circuit is stored in said capacitance through said CMOS circuit devices.

4. A semiconductor circuit device comprising:

a first circuit block having a higher transition probability of input signal;

a second circuit block having a lower transition probability of input signal;

a first capacitance for storing an electric charge of said first circuit block;

a first switching circuit for connecting a first power supply pin of said first circuit block to a power supply or said first capacitance;

a second capacitance having a capacity value smaller than that of said first capacitance and for storing an electric charge of said second circuit block; and a second switching circuit for connecting second power supply pin of said second circuit block to said power supply or said second capacitance;

wherein said first switching circuit connects said first power supply pin to said first capacitance to store the electric charge of said first circuit block in said first capacitance before a first input signal to said first circuit block is changed, said first circuit block is charged with the electric charge stored in said first capacitance when said first input signal is changed, and said first switching circuit subsequently disconnects said first power supply pin from said first capacitance and connects said first power supply pin to said power supply to further charge said first circuit block after said first input signal is changed, and said second switching circuit connects said second power supply pin to said second capacitance to store the electric charge of said second circuit block in said second capacitance before a second input signal to said second circuit block is changed, said second circuit block is charged with the electric charge stored in said second capacitance when said second input signal is changed, and said second switching circuit subsequently disconnects said second power supply pin from said second capacitance and connects said second power supply pin to said power supply to further charge said second circuit block after said second input signal is changed.

* * * * *